United States Patent [19]

Ono et al.

[11] Patent Number: 4,974,201

[45] Date of Patent: Nov. 27, 1990

[54] PROCESS FOR TRANSFERRING BLOCH LINES FORMED IN A MAGNETIC WALL OF A MAGNETIC DOMAIN, AND A MAGNETIC MEMORY APPARATUS FOR RECORDING AND REPRODUCTION OF INFORMATION BY TRANSFERRING BLOCH LINES IN UTILIZING SAID TRANSFERRING PROCESS

[75] Inventors: Takeo Ono, Atsugi; Hitoshi Oda, Yokohama, both of Japan

[73] Assignee: Canon Kabushiki Kaisha, Tokyo, Japan

[21] Appl. No.: 72,668

[22] Filed: Jul. 13, 1987

[30] Foreign Application Priority Data

Jul. 14, 1986 [JP] Japan ................................. 61-163801
Jul. 14, 1986 [JP] Japan ................................. 61-163802

[51] Int. Cl.$^5$ ............................................. G11C 19/08
[52] U.S. Cl. ........................................ 365/29; 365/36
[58] Field of Search ........................... 365/29, 36, 87

[56] References Cited

U.S. PATENT DOCUMENTS

| | | | |
|---|---|---|---|
| 3,887,905 | 6/1975 | Bobeck et al. | 365/29 |
| 4,128,895 | 12/1978 | Almasi et al. | 365/36 |
| 4,583,200 | 4/1986 | Konishi et al. | 365/29 |
| 4,589,094 | 5/1986 | Takauchi et al. | 365/36 |

OTHER PUBLICATIONS

IEEE Transactions on Magnetics-vol. Mag-8, Sep. 1972; pp. 405-407.
"Charged Wall Formation and Propagation Analysis in Ion-Implanted Contiguous Disk Bubble Devices:", J. Appl. Phys., vol. 53, No. 8, pp. 5815-5822, Aug. 1982.
"Vertical Bloch Line Pair Operation by In-Plane Field for Bloch Line Memory", IEEE Transactions on Magnetics, vol. Mag-22, No. 5, pp. 793-795, Sep. 1986.

*Primary Examiner*—James W. Moffitt
*Attorney, Agent, or Firm*—Fitzpatrick, Cella, Harper & Scinto

[57] ABSTRACT

A process for transferring Bloch lines formed in a magnetic wall of a magnetic domain and a magnetic memory apparatus for recording/reproducing information in utilizing Bloch lines formed in the magnetic wall of the magnetic domain as a information carrier are disclosed. The process comprises steps of forming a positive or negative magnetic charge area in the magnetic wall, thereby attaching a Bloch line to the area, and moving the magnetic charge area, thereby moving the Bloch line. The apparatus comprises a memory substrate having a stripe-shaped magnetic domain, a way to write Bloch lines in the magnetic wall of the stripe-shaped magnetic domain according to input information, a way to read the Bloch lines so stored to reproduce the information in the form of electric signals and a way to apply a rotating magnetic field parallel to the plane of the memory substrate, to the stripe-shaped magnetic domain, to move the Bloch lines along the magnetic wall. As a result, the Bloch lines so written are transferred in succession to another location in the domain or to a read-out area.

5 Claims, 7 Drawing Sheets

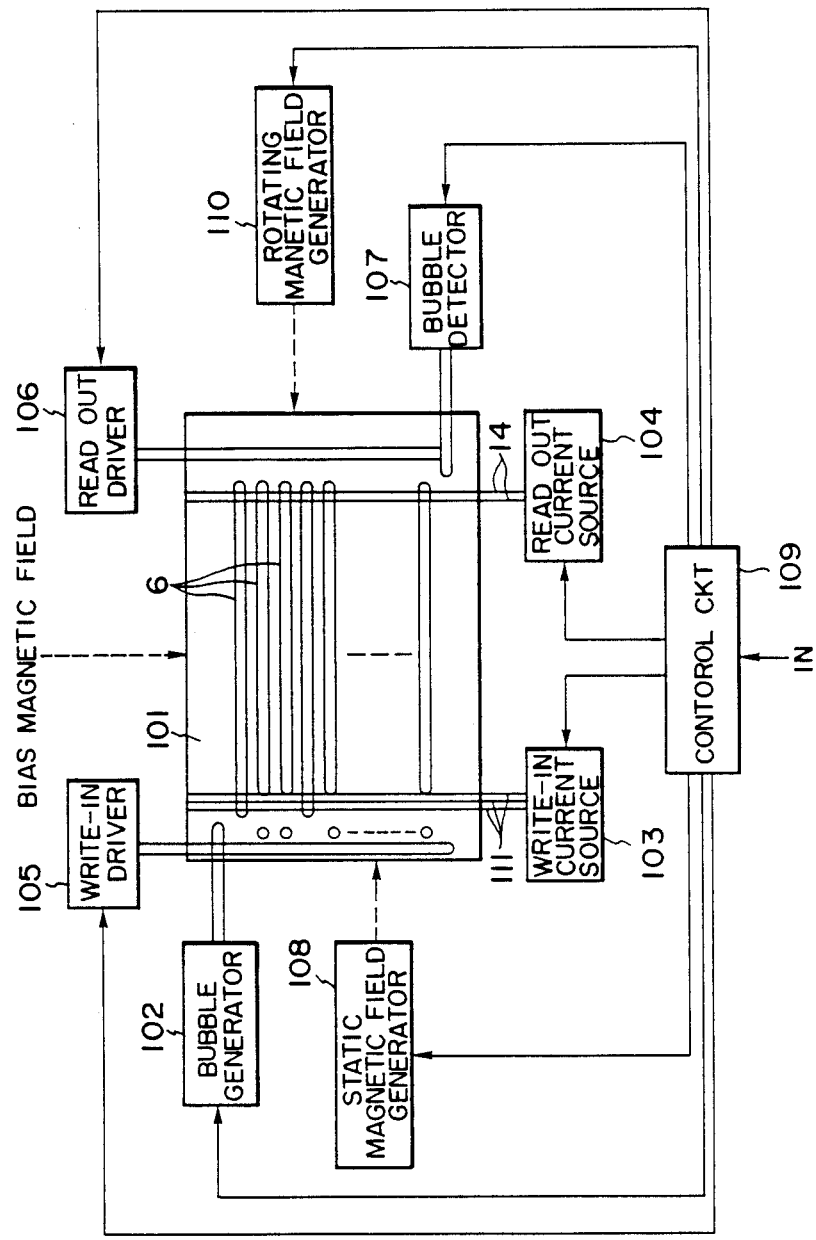

PROCESS FOR TRANSFERRING BLOCH LINES FORMED IN A MAGNETIC WALL OF A MAGNETIC DOMAIN, AND A MAGNETIC MEMORY APPARATUS FOR RECORDING AND REPRODUCTION OF INFORMATION BY TRANSFERRING BLOCH LINES IN UTILIZING SAID TRANSFERRING PROCESS

BACKGROUND OF THE INVENTION

1. Field of the Invention

The present invention relates to a process for transferring Bloch lines, adapted for use in a magnetic memory apparatus for recording and reproduction of information utilizing, as a unit information carrier, a Bloch line formed in a magnetic wall of a stripe magnetic domain.

It also relates to a magnetic memory apparatus for recording and reproduction of information by transferring Bloch lines by a transfer process different from that in the prior technology.

Such magnetic memory apparatus, being capable of information recording at an extremely high density, can be utilized as a general-purpose memory in various electronic apparatus.

2. Related Background Art

For memories such as external memories of computers, memories for electronic files, memories for still picture files, etc., there are employed various memory devices such as magnetic tapes, Winchester disks, floppy disks, optical disks, magnetooptical disks, magnetic bubble memories, etc. These memory devices, with the exception of the magnetic bubble memory, require a relative movement of the record/reproducing head with respect to the memory, for the recording or reproduction of information. Such relative movement of the head achieves recording of a train of information on an information track, or reproduces the train of information recorded on such information track.

However, with the progress in the recording density in recent years, there is required a complex tracking control for causing the head to exactly follow the information track. The quality of the reproduced signal deteriorates if said control is insufficient, or by vibration of a head moving mechanism or by dust deposited on the memory medium. Also, in a case of a memory in which recording and reproduction are conducted with the memory in contact with a head, such as magnetic tape, the memory medium suffers abrasion due to friction, while a memory conducting recording and reproduction in a non-contact state, such as the optical disk, requires focusing control and tracking control, and the quality of the reproduced signal may be deteriorated if such controls are insufficient.

On the other hand, as the assignee of the present invention has already disclosed in U.S. patent application Ser. No. 801,401, filed Nov. 25, 1985, the magnetic bubble memory can record information at a predetermined position, can transfer the recorded information and reproduce the information at a predetermined position while the information is transferred. Consequently it does not require the relative movement of the head for recording and reproduction, and is free from the above-mentioned drawbacks of other memories when the recording density is increased, thus achieving high reliability.

However, the magnetic bubble memory, utilizing a bubble or a circular magnetic domain formed by applying a magnetic field to a magnetic thin film having an axis of easy magnetization in the perpendicular direction, such as a magnetic garnet film, as an information bit, is associated with a limitation of recording density of several tens of Mbits/cm$^2$ even when there are employed minimum bubbles (0.3 μm in diameter) obtainable with current garnet film, and a higher recording density is difficult to achieve.

For this reason attention is recently being paid to a Bloch line memory disclosed in U.S. Pat. No. 4,583,200 having a recording density exceeding the limit of the recording density of the above-mentioned magnetic bubble memory. The assignee of the present invention has already proposed a recording/reproducing method for the Bloch line memory in U.S. patent application Ser. No. 800,770, filed Nov. 22, 1985. Said Bloch line memory, utilizing, as the information bit, a Bloch line or a Nail magnetic wall structure sandwiched between a Bloch magnetic wall structure present around a magnetic domain formed in a magnetic thin film, can achieve a recording density almost two digits higher than that of the magnetic bubble memory. For with a garnet film with a bubble diameter of 0.5 μm, it can achieve a recording density of 1.6 Gbits/cm$^2$.

FIG. 1 is a schematic perspective view of an example of a magnetic substance constituting a Bloch line memory represented by the above-mentioned U.S. Pat. No. 4,583,200.

In FIG. 1 a substrate 2 composed of a non-magnetic garnet such as GGG or NdGG is provided thereon with a thin film 4 of magnetic garnet. Said film can be formed for example by liquid phase epitaxial growth (LPE), and has a thickness for example of 5 μm. In the thin magnetic garnet film 4 there is formed a stripe-shaped magnetic domain 6, and a magnetic wall 8 is formed as a boundary area. Said stripe-shaped magnetic domain 6 is for example 5 μm in width and 100 μm in length. The magnetic wall 8 has a thickness for example of ca. 0.5 μm. In the domain 6 the magnetization is upward as indicated by an arrow A, and, outside the domain 6, the magnetization is downward as indicated by an arrow B.

In the magnetic wall 8, the magnetization is gradually twisted from inward (directed toward the domain 6) to outward, or from direction A to direction B, and the direction of said twisting is inverted across a Bloch line 10 vertically present in the magnetic wall 8. In FIG. 1, arrows C indicate the direction of magnetization at the center in the thickness of the magnetic wall 8, while arrows D indicate the direction of magnetization in the Bloch line 10.

To the magnetic member including the above-explained stripe-shaped magnetic domain 6, there is applied a downward bias magnetic field $H_B$ generated for example by a permanent magnet.

As shown in FIG. 1, the magnetic wall 8 contains two kinds of Bloch lines with different directions of magnetization, and such Bloch lines of different kinds constitute a Bloch line pair. The presence or absence of such a Bloch line pair is respectively assigned to information "1" or "0". Said Bloch line pair is present in a regular position in the magnetic wall 8. More specifically, each Bloch line pair is present in one of a plurality of potential wells to be explained later. Also as will be explained later, the Bloch line pair is transferred to an adjacent potential well, by the application of a pulse magnetic field vertical to the plane of the substrate. Consequently information recording into the Bloch line memory (writing of a Bloch line pair into the magnetic wall 8) and information reproduction from said memory (reading of a Bloch line pair from the magnetic wall 8) can be effected at a predetermined position, while the Bloch line pairs are transferred in the magnetic wall 8. Said recording and reproduction of information can be made by applying a pulse magnetic field of a predetermined intensity vertical to the substrate at a predetermined position, and, though not illustrated in FIG. 1, conductor patterns for applying the pulse magnetic field for recording and reproduction are provided on the magnetic film 4, at predetermined positions with respect to the stripe-shaped magnetic domain 6.

In the Bloch line memory explained above, the potential wells for the Bloch line pairs are formed for example by providing, on the magnetic thin film, regular patterns for stabilizing the Bloch lines, in such a manner as to cross the magnetic wall.

FIG. 2 is a partial plan view of a Bloch line memory showing an example of such stabilizing pattern.

Referring to FIG. 2, the magnetic film 4 is surfacially provided with a plurality of parallel conductor patterns 9 extended in a direction to cross the stripe-shaped magnetic domain 6. Said patterns 9 are composed for example of Cr, Al, Au or Ti and have a width of for example 0.5 $\mu$m and a pitch of for example 1 $\mu$m. Said regular conductor patterns 9 generate magnetic stress, thus forming periodic potential wells in the magnetic wall 8. Said conductor patterns 9 may also be replaced by magnetic layers or patterns formed in the vicinity of the surface of the magnetic film 4, by the implantation of H ions, He ions or Ne ions. The potential wells formed by such patterns are symmetrical in the direction of transfer of the block lines.

As disclosed in the mentioned U.S. Pat. No. 4,583,200, the above-explained transfer of Bloch lines is conducted by applying a pulse magnetic field perpendicular to the magnetic film 4 and utilizing the precession of magnetization constituting thus resulting Bloch line, thus realizing transfer to the neighboring potential well. However, in the case of the symmetrical potential wells explained above, a simple square pulse magnetic field cannot achieve stable transfer to a particular direction. For this reason, the irreversible transfer in a particular direction has been achieved by a particular transfer pulse magnetic field $H_p$ having a downshift time sufficiently longer than the upshift time, as shown in FIG. 3.

However, in comparison with the case of a square pulse magnetic field, such transfer pulse magnetic field requires a complex electric circuit for pulse generation, and it is difficult to improve the transfer rate because of the long downshift time.

In addition, the application of the perpendicular magnetic field shifts not only the Bloch line but also the magnetization of the entire magnetic wall, or the magnetic wall itself. Thus the interaction of the movements of the magnetic wall in plural stripe-shaped magnetic domains tends to cause vibration of the magnetic walls, eventually resulting in abnormal transfer of Bloch lines.

Also, the mobility of a Bloch line in response to the application of the perpendicular pulse magnetic field is different between a curved portion of the magnetic wall at the end of the stripe-shaped magnetic domain and a linear portion of the magnetic wall in the middle of said domain, so that the transfer margin or the range of magnetic field intensity suitable for the Bloch line transfer becomes inevitably small.

In addition there is required a large external coil for uniformly applying a perpendicular pulse magnetic field to the entire memory, so that it is difficult to make the memory device compact.

SUMMARY OF THE INVENTION

In consideration of the drawbacks in the conventional transfer method of Bloch lines, an object of the present invention is to provide a Bloch line transfer process capable of transferring Bloch lines in a simple manner with a high speed.

Another object of the present invention is to provide a magnetic memory apparatus capable of high speed recording and high speed reproduction of information by high-speed transfer of Bloch lines with a novel process.

The foregoing objects can be achieved, according to the present invention, by a process comprising the steps of forming a positive or negative magnetic charge area in the magnetic wall of the magnetic domain, attracting the Bloch line to the positive or negative magnetic charge area, and moving the magnetic charge area along the magnetic wall thereby displacing the Bloch line.

Also a magnetic memory apparatus of the present invention may comprise a memory substrate having plural stripe-shaped magnetic domains; means for writing Bloch lines into the magnetic walls of said stripe-shaped magnetic domains according to input signals; means for reading the Bloch lines in the magnetic walls of the stripe-shaped magnetic domains and converting said lines into electrical signals; and means for generating a magnetic field rotating in-plane, for transferring the Bloch lines in the magnetic walls of the stripe-shaped magnetic domains along said magnetic walls.

Still other objects, features and advantages of the present invention will become fully apparent from the following detailed description of the preferred embodiments. However, the present invention is not limited to the following embodiments but can be applied to various transfer processes and various magnetic memory apparatus, based on the basic concept of the present invention.

BRIEF DESCRIPTION OF THE DRAWINGS

FIGS. 3A and 3B illustrate an embodiment of the Bloch line transfer process of the present invention, wherein FIG. 3A is a partial plan view of a Bloch line memory in which Bloch lines are transferred by said process, and FIG. 3B is a cross-sectional view along line B—B in FIG. 3A;

FIG. 10 is a block diagram of a magnetic memory apparatus in which the information is transferred by the Bloch line transfer process shown in FIGS. 3A and 3B to FIG. 5.

DETAILED DESCRIPTION OF THE PREFERRED EMBODIMENTS

Figure 3:
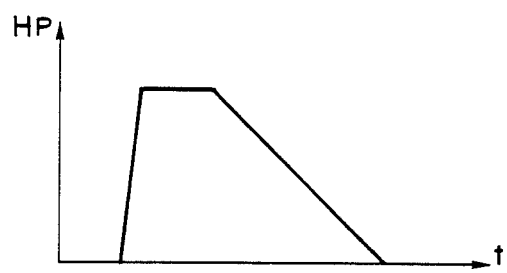
FIG. 3 is a graph showing a pulse magnetic field for transferring a Bloch line.
Figure 3A:
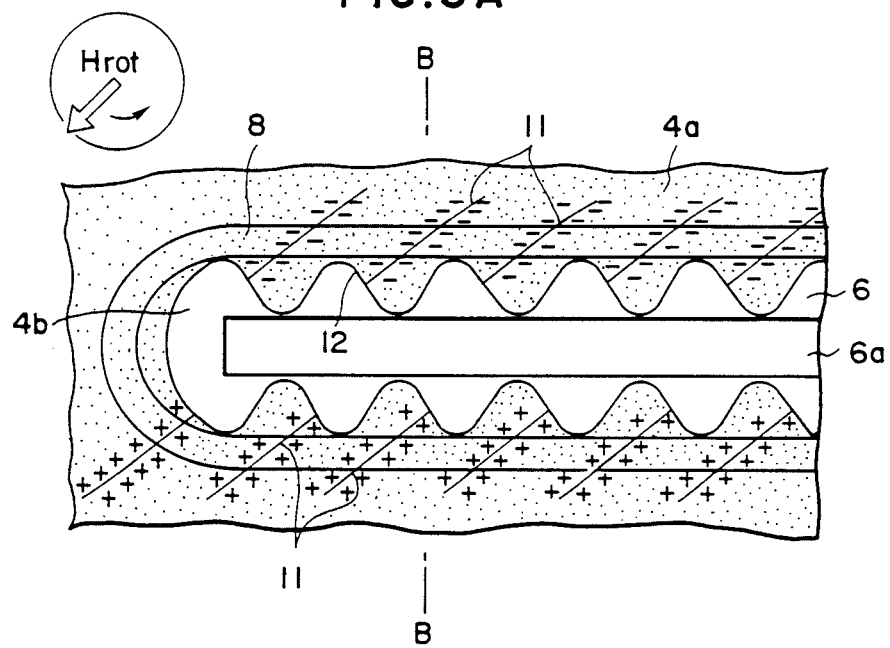
Figure 3B:
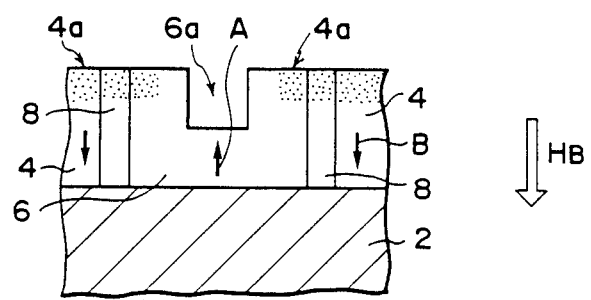

FIGS. 3A and 3B illustrate an embodiment of the Bloch line transfer process of the present invention, wherein FIG. 3A is a partial plan view of a Bloch line memory in which Bloch lines are transferred according to the process of the present invention, while FIG. 3B is a cross-sectional view along a line B—B shown in FIG. 3A.

In FIGS. 3A and 3B, a magnetic garnet substrate 2 is provided with a thin magnetic garnet film 4, in which is formed a magnetic domain 6 of a stripe plan shape, with a magnetic wall 8 therearound. At the surface of the stripe-shaped domain 6 there is formed a groove 6a approximately coinciding with said domain 6 in shape, for the purpose of stabilizing the position of the domain 6. In FIGS. 3A and 3B, arrows indicate the direction of magnetization or magnetic field.

In the stripe-shaped magnetic domain 6 the magnetization is upwards as indicated by the arrow A, while in the magnetic film 4 outside said domain 6 the magnetization is downward as indicated by the arrow B. There is applied an external downward bias magnetic field $H_B$.

In the vicinity of the surface of the magnetic film 4 there is formed an ion implanted area 4a, excluding said groove 6a and an area therearound. As shown in FIG. 3A, a boundary line 12 between the ion implanted area 4a and non-implanted area 4b has a periodic undular form. The magnetic wall 8 is entirely covered by the ion implanted area 4a. The ions to be implanted are preferably those with a relatively small ion radius such as H ions, He ions or Ne ions, and such ions are implanted with an energy of several KEV to several tens of KeV to obtain an implanted area of a depth up to 1000 Å in the vicinity of the surface of the magnetic film 4. The ion implanted area 4a can be arbitrarily shaped by a suitable mask employed during the ion implantation.

In an area of the magnetic film 4 corresponding to the ion implanted area 4a, the magnetization which is originally perpendicular to the magnetic film 4 is diverted into the planar direction to form a longitudinal magnetization area.

Though not illustrated, there is provided, in the present embodiment, means for generating a magnetic field which rotates in a plane parallel to the magnetic film, for example a set of mutually orthogonal coils, and an arrow Hrot indicates such longitudinal magnetic field generated by said means.

In the present embodiment the longitudinal magnetic field Hrot of an order of 100 Oe is applied to the magnetic film 4, and, when it is directed as indicated in FIG. 3A, a charged wall 11 is developed in said ion implanted area 4a, from the boundary with the non-implanted area 4b, extending approximately in the direction of said longitudinal magnetic field. Said charged wall is extended from a position where the boundary line 12 between the ion implanted area 4a and the non-implanted area 4b is substantially perpendicular to the direction of said longitudinal magnetic field Hrot. For the details of "charged wall" reference is to be made to J. Appl. Phys., Vol. 53, No. 8, pages 5815–5822, August 1982, for example.

Said charged wall 11 extends from a position where the boundary line 12 is concave to the ion implanted area 4a. When the longitudinal magnetic field Hrot is oblique in the direction illustrated, negative magnetic charges are concentrated on the charged walls 11 in the upper half of FIG. 3A, while positive magnetic charges are concentrated on the charged walls 11 in the lower half. Consequently, at the boundary line 12 from which the charged wall extends, there will be concentrated magnetic charge of a polarity opposite to that of the magnetic charge on said charged wall. The charged walls 11 cross the magnetic wall 8 at a regular pitch, since the boundary line 12 between the ion implanted area 4a and the non-implanted area 4b has a regular periodic form.

Figure 4:
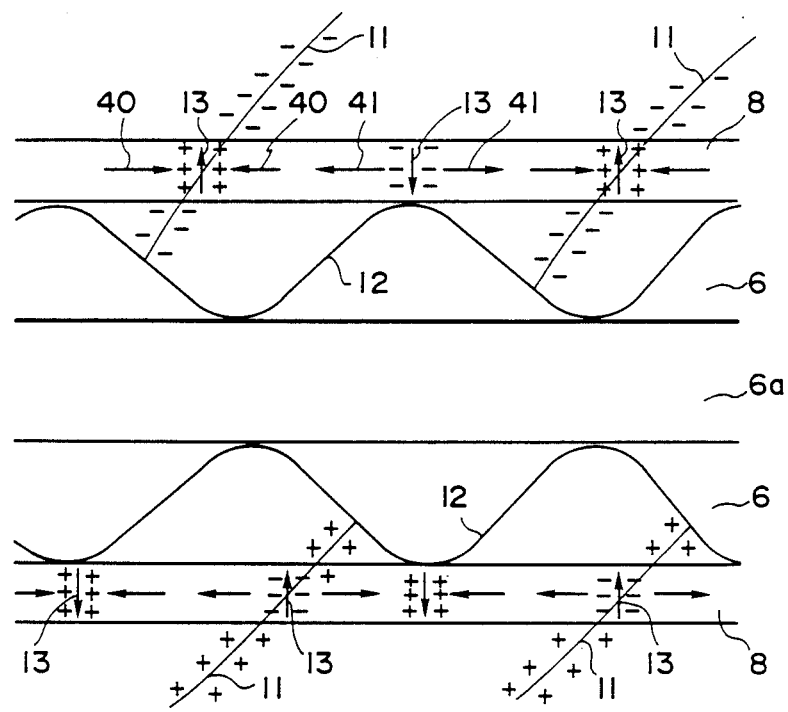
FIG. 4 is a partial magnified view of the Bloch line memory shown in FIG. 3A, showing the mode of Bloch line transfer in combination with FIG. 5.

FIG. 4 is a partial magnified view of the Bloch line memory shown in FIG. 3A.

As shown in FIG. 4, the magnetic wall 8 contains Bloch lines 13 of two different kinds; one having mutually inward magnetizations 40 directed to the Bloch line in the magnetic wall, and the other having mutually outward magnetizations 41 directed opposite to the Bloch line. This difference in magnetization induces the difference in the polarity of magnetic charge concentrated at the magnetic wall around the Bloch line 13. More specifically, positive charges are concentrated at the magnetic wall around a Bloch line 13 sandwiched between the mutually inward magnetizations 40, while negative charges are induced at the magnetic wall around a Bloch line 13 sandwiched between the mutually outward magnetizations 41. Consequently, at the positions where the upper charged walls 11 cross the magnetic wall 8, the Bloch lines 13 with concentrated positive magnetic charges are attracted by the negative magnetic charges concentrated on said charged walls 11. The Bloch line 13 with concentrated negative charge is repelled by the negative magnetic charges of the charged walls 11 and becomes positioned between two Bloch lines with positive magnetic charges. A similar situation occurs for the lower charged walls 11.

Figure 5:
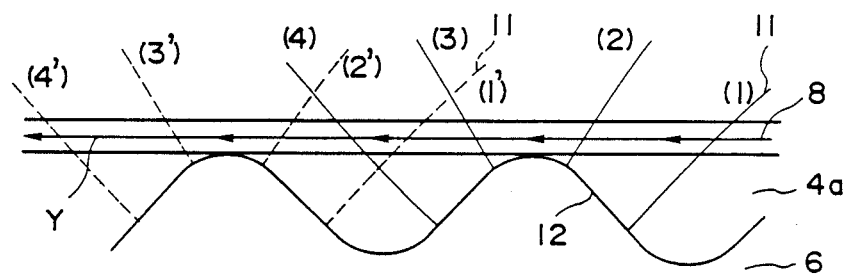
FIG. 5 is a schematic view showing the mode of Bloch line transfer.

When the longitudinal magnetic field Hex is rotated as shown in FIG. 3A, the direction of the charged walls 11 varies as shown in FIG. 5.

In response to an anticlockwise rotation of the longitudinal magnetic field Hrot as shown in FIG. 3A, the charged walls 11, originally in a state shown in FIGS. 3A and 3B or a state (1) in FIG. 5, move in succession to a state (2), then (3) and (4). In response the Bloch line 13 moves in a direction Y in the magnetic wall 8, either being attracted or repelled by the magnetic charge concentrated on the charged walls 11.

A further rotation of the longitudinal magnetic field Hrot then induces charged walls 11 with positive magnetic charges, which move in succession as indicated by (1'), (2'), (3') and (4'). The Bloch line 13 with negative magnetic charge, which has been repelled by the charged walls 11 with the negative magnetic charge in the above-mentioned state (4) is not attracted by the charged wall 11 with the positive charge and moves in the direction of the arrow in the magnetic wall. At the same time the Bloch line 13 with positive magnetic charge moves in the same manner as in the above-mentioned states (1)-(4).

The above-explained procedures are repeated by the continuation of rotation of the longitudinal magnetic field Hrot, whereby the Bloch lines 13 can be transported a desired distance. In order to achieve smooth transfer of the Bloch lines, the boundary line 12 between the ion implanted area 4a and the non-implanted area 4b is preferably so patterned that, at the transition from the state (4) to the state (1'), a Bloch line 13 to be attracted is just positioned at the charged wall 11.

In order to maintain the charged walls 11 when the magnetic field generator for said longitudinal rotating magnetic field Hrot is turned off, thereby maintaining the Bloch lines 13 at the predetermined positions, a magnetic field having a component parallel to the magnetic film 4 is applied for example by a permanent magnet which is incorporated in said magnetic field generator and is suitably inclined.

In the foregoing embodiment a groove 6a is formed for stabilizing the position of the stripe-shaped magnetic domain 6, but said groove may be replaced by a magnetic film, placed in a similar position and having an axis of easy magnetization perpendicular to the plane of the magnetic film. Said magnetic film is preferably composed of a Ba-ferrite magnetic substance with a satisfactory atmospheric resistance and a high coercivity, such as $BaO-n(Fe_2O_3)$, $BaO-n(Fe_{2-x}Co_xO_3)$, $BaO-n(Fe_{2-x}Sc_xO_3)$, $BaO-n(Fe_{2-x}Zn_xO_3)$, $BaO-n(Fe_{2-x}Ni_xO_3)$ or $BaO-n(Fe_{2-x}Mn_xO_3)$. The film of such oxide magnetic substance can be easily obtained for example by sputtering, with a shorter time than in the case of the above-mentioned groove, so that the manufacturing time can be reduced.

As explained in the foregoing, the transfer of the Bloch lines can be achieved stably and securely, at a high speed and in quasi-static manner by applying a longitudinal magnetic field to generate charged walls in predetermined positions in the vicinity of the surface of the magnetic film and by rotating said longitudinal magnetic field. Also the present invention enables satisfactory transfer of Bloch lines both in the curved portion and in the linear portion of the magnetic wall simply by applying a magnetic field of an intensity necessary for generating the charged walls, so that the transfer margin can be made very large. Also large coils are not required since the application of the vertical pulse magnetic field is no longer necessary, so that the memory device can be made compact.

Figure 1:
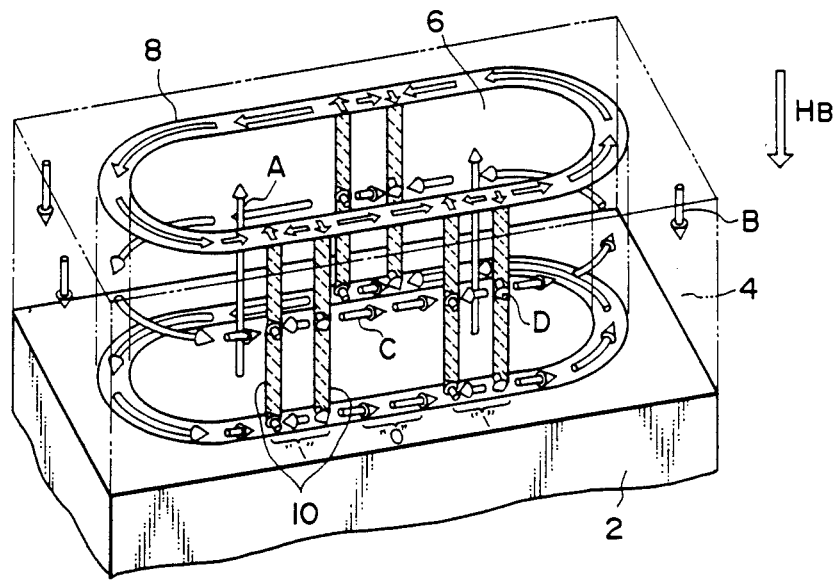
FIG. 1 is a schematic perspective view of an example of a magnetic substance constituting a Bloch line memory.
Figure 2:
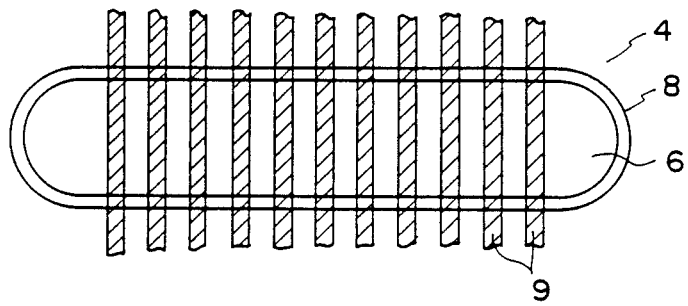
FIG. 2 is a partial plan view of a Bloch line memory showing an example of stabilizing pattern.

It is also effective to form the potential wells by the patterns shown in FIG. 2 for stabilizing the Bloch lines in the magnetic wall, and to form an area capable of generating the charged walls in the magnetic film. In such case the above-mentioned permanent magnet for stabilizing the positions of the Bloch lines may become unnecessary.

Figure 6:
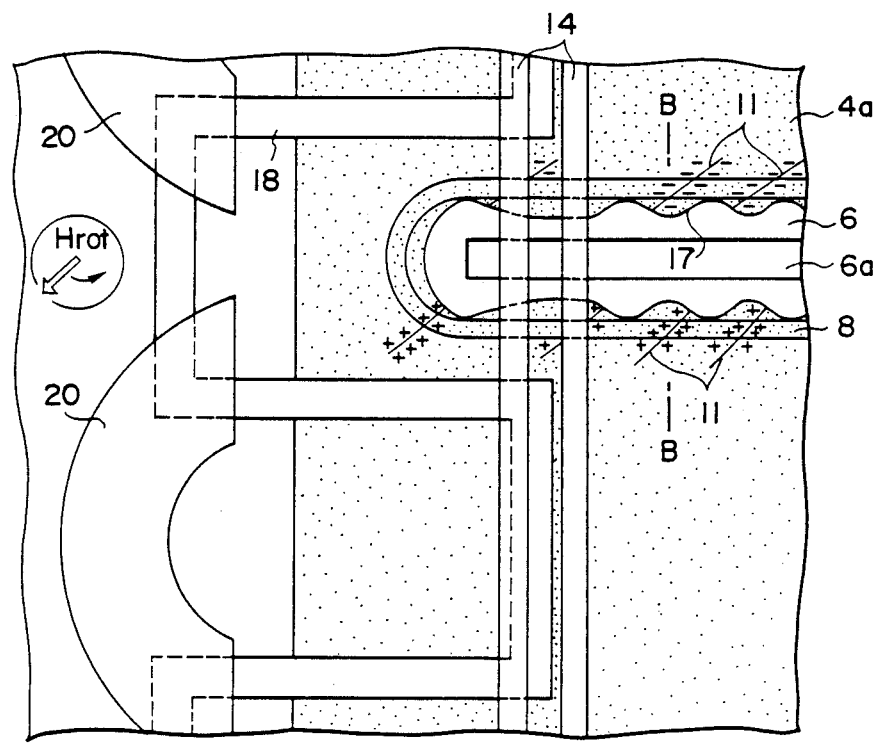
FIG. 6 is a partial plan view of the Bloch line memory shown in FIG. 3A, illustrating a Bloch line reading area.

FIG. 6 is a partial plan view of the Bloch line memory shown in FIG. 3A, indicating a Bloch line reading part.

In FIG. 6, the same components as those in FIG. 3A are represented by the same numbers, and will not be explained further.

On the magnetic film 4 there is formed a conductor line 18 for extracting the magnetic bubbles. Said conductor line is so patterned as to form a recess in a position corresponding to the end portion of a stripe-shaped magnetic domain 6, and meanders therefore with a pitch the same as that of the arrangement of the stripe-shaped magnetic domains 6.

Also on said magnetic film 4 there is provided a pair of conductor lines 14 for cutting the stripe-shaped magnetic domain 6, in such a manner as to cross the end portion of the magnetic domain 6. Said conductor lines 14 are separated, by an insulating layer, from the conductor line 18 for extracting the magnetic bubbles.

The method of reading the Bloch lines in the form of magnetic bubbles by means of the paired conductor lines 14, shown in FIG. 6, is described in U.S. Pat. No. 4,583,200.

On said conductor line 18 there are provided magnetic bubble transferring patterns 20 positioned along plural recesses of the meandering pattern of said conductor line 18. Said transferring pattern is composed of a substantially semi-circular pattern composed of a magnetic substance such as permalloy and so positioned as to bridge two adjacent recesses of the conductor pattern 18.

In the above-explained embodiment, the transfer of Bloch lines in the magnetic wall 8, and the transfer to a detector of magnetic bubbles formed from the magnetic domain 6 in a method as disclosed in U.S. Pat. No. 4,583,200 are conducted in the following manner.

The application of a longitudinal magnetic field of an intensity for example of 100 Oe generates, for example at a direction of said magnetic field Hex shown in FIG. 6, charged walls 11 in the ion implanted area 4a, extending from the boundary line 17 with the non-implanted area and in a direction substantially along the direction of said longitudinal magnetic field. Said charged walls extends from positions where the boundary line 17 between the ion implanted area 4a and the non-implanted area 4b is substantially perpendicular to the direction of the longitudinal magnetic field Hex and where said boundary line 17 is concave to the ion implanted area 4a. When said longitudinal magnetic field Hex is oblique in a direction as shown in FIG. 6, negative magnetic charges are concentrated on the charged walls 11 in the upper half in FIG. 6, while positive magnetic charges are concentrated on the charged walls 11 in the lower half. Corresponding to such charges, in the positions of the boundary line 17 from which said charged walls extend, there are induced magnetic charges of a polarity opposite to that of the magnetic charge on said charged walls. Said charged walls 11 cross the magnetic wall 8 at a regular pitch, since the boundary line 17 between the ion implanted area 4a and the non-implanted area 4b has a regular periodic form. Said pitch on the boundary line 17 is however longer in the vicinity of the end portion of the magnetic domain 6.

According to the principle explained before, the Bloch lines in the magnetic wall 8 are placed in the predetermined positions by attraction or repulsion by said charged walls 11.

The Bloch lines positioned by said charged walls 11 are transferred in a predetermined direction by the charged walls which are moved along the change in direction of the rotating longitudinal magnetic field Hrot.

Figure 7:
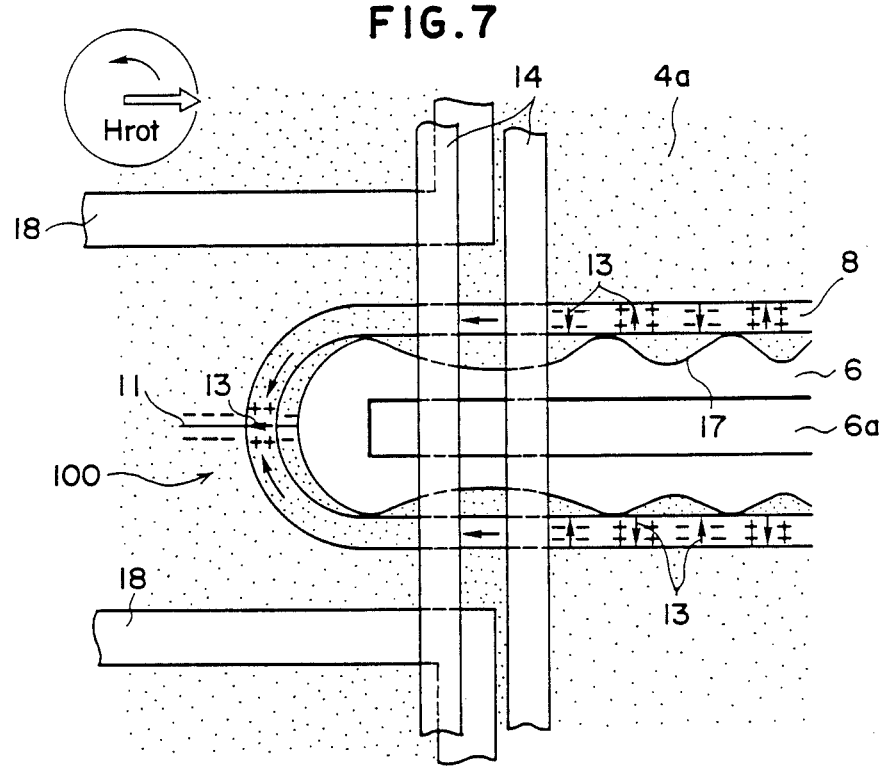
FIG. 7 is a schematic view of a state in which a Bloch line is present in the end portion of the stripe-shaped magnetic domain in the reading area shown in FIG. 6.

When the longitudinal magnetic field Hrot assumes the direction shown in FIG. 7 in the course of the transfer of the Bloch lines in the magnetic wall by the charged walls 11, a Bloch line 13 is positioned at the end portion 100 of the stripe-shaped magnetic domain as shown in FIG. 7. (Naturally, depending upon the recorded information, there may be no Bloch line present at said end portion.) In such state mutually opposite currents of a predetermined intensity are supplied to the conductor lines 14 for cutting the magnetic domain, as described in U.S. Pat. No. 4,583,200.

In the present embodiment, since the repeating pitch of the boundary line 17 is longer at the end portion of the magnetic domain, it is rendered possible, in cutting the magnetic domain, to position only one Bloch line at the end portion and to place a pairing Bloch line at a relatively distant stable position.

Figures 8A, 8B:
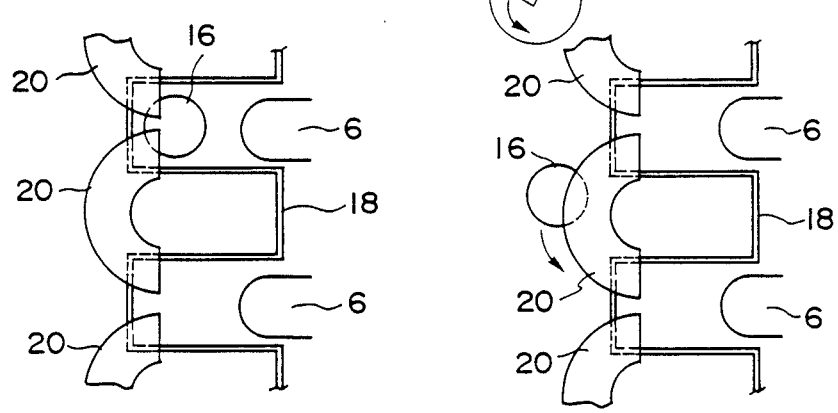
FIGS. 8A and 8B are schematic views showing a transfer process for a magnetic bubble formed corresponding to the presence or absence of the Bloch line.

FIGS. 8A and 8B schematically illustrate the transfer of thus generated magnetic bubble.

At first a current is supplied to the conductor line 18 for extracting the magnetic bubble, thereby generating a magnetic field of a direction same as that of the magnetization in the bubble 16 and attracting said magnetic bubble toward the recess, eventually to the position of the bubble transferring magnetic pattern 20, as shown in FIG. 8A. Subsequently the longitudinal magnetic field Hrot is rotated, whereby the magnetic bubble 16 is moved in the direction of the arrow, as the result of change in magnetization in said magnetic pattern 20, as shown in FIG. 8B.

Thus the magnetic bubbles 16 are transferred in succession through the semicircular patterns by the continued rotation of the longitudinal magnetic field Hrot and time-sequentially reach a magnetic bubble detector for detection by a magnetic resistance effect, as described in U.S. Pat. No. 4,583,200.

The semicircular magnetic patterns 20 explained above may be replaced by patterns of various forms employed in ordinary magnetic bubble memory devices.

Also the magnetic bubbles can be detected not only by such magnetic resistance effect but also by an optical detecting method proposed by the assignee of the present invention in the U.S. patent applications Ser. Nos. 801,401 mentioned above, and 804,111, filed Dec. 3, 1985, or other magnetic detecting methods.

Figure 9:
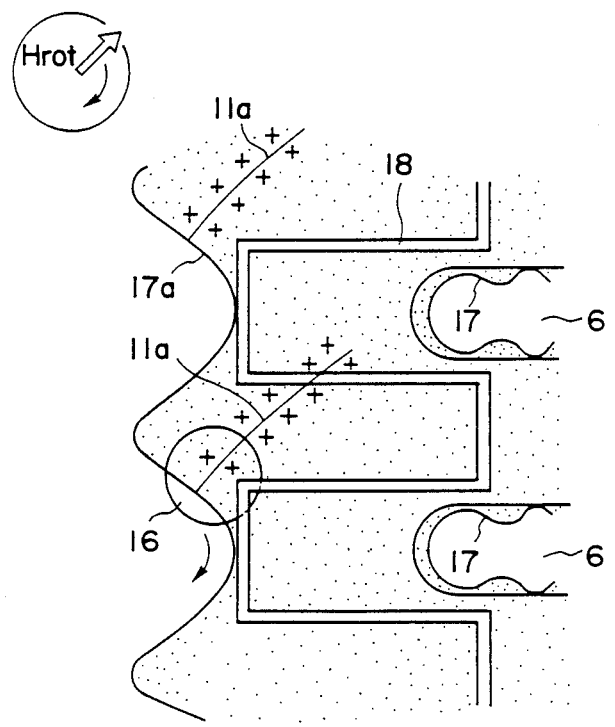
FIG. 9 is a partial plan view showing another embodiment of the Bloch line reading area of the Bloch line memory shown in FIG. 3A.

FIG. 9 is a partial plan view of another embodiment of the reading part of the Bloch line memory shown in FIG. 3A.

The present embodiment is different from that shown in FIG. 6 in the pattern for transferring the magnetic bubbles. In the present embodiment the boundary line 17a between the ion implanted area 4a and the non-implanted area 4b is formed along the recesses of the conductor line 18 for extracting the magnetic bubbles, and has a regular undular form same as the aforementioned boundary line 17. The pitch of said boundary line 17a is the same as that of the arrangement of the stripe-shaped magnetic domains 6. In the present embodiment the longitudinal magnetic field Hrot generates magnetic walls 11a, of which magnetic charges either attract or repel the magnetic bubbles. Thus the magnetic bubbles 16 can be transferred along the boundary line 17a in the same manner as the Bloch lines 13, by the rotation of the longitudinal magnetic field Hrot.

In the present embodiment the Bloch lines 13 and the magnetic bubbles 16 are both transferred by the movement of the charged walls. The manufacturing process of the memory device can be simplified since the transfer patterns for these two transfers can be formed with a single mask, during the formation of the ion implanted area 4a.

As explained above, the transfer of the Bloch lines can be stably and securely, at a high speed in a quasi-static manner, by applying a longitudinal magnetic field to generate charged walls in predetermined positions in the vicinity of the surface of the magnetic film and by rotating said longitudinal magnetic field. Also the present invention enables satisfactory Bloch line transfer both in the curved portion and in the linear portion of the magnetic wall simply by applying a magnetic field of an intensity enough for generating the charged walls, so that the transfer margin can be made very large. Also the transfer of the Bloch lines and the transfer of the magnetic bubbles can be achieved commonly by the rotation of the longitudinal magnetic field in efficient manner, and the structure of the memory device can be simplified. In addition, large coils are not required since the application of vertical pulse magnetic field is no longer necessary, so that the memory device can be made compact.

FIG. 10 is a schematic block diagram of a magnetic memory apparatus in which the information is transferred by the process of the present invention.

In FIG. 10, 101 indicates a Bloch line memory substrate containing a plurality of stripe-shaped magnetic domains 6, of which magnetic walls record information in the form of arrangement of Bloch lines. A magnetic bubble generator 102 generates time-sequentially according to input information, and said magnetic bubbles, indicating information, are transported to a corresponding magnetic domain 6 by a write-in driver 105. A read-out driver 106 converts the Bloch lines into magnetic bubbles explained in relation to the foregoing embodiment, and transfers said magnetic bubbles to a bubble detector 107, which time-sequentially detects the magnetic bubbles by a magnetic resistance effect and converts said bubbles into electric signals.

There are also provided a write-in current source 103 for supplying a current to a write-in conductor 111 at the writing operation of Bloch lines, and a read-out current source 104 for supplying a current to a Bloch line reading conductor 14.

The Bloch line memory substrate 101 is given a bias magnetic field of a direction perpendicular to the plane of said substrate.

A rotating longitudinal magnetic field generator 110 applies a rotating longitudinal magnetic field to the substrate 101, thereby transferring the Bloch lines formed in the magnetic walls of the stripe-shaped magnetic domains 6. As explained before, said generator 110 generates the magnetic field for example with orthogonal coils.

A static longitudinal magnetic field generator 108 is utilized for generating the charged walls in a predetermined direction, thereby stabilizing the Bloch lines in the magnetic walls of the stripe-shaped magnetic domains 6, when the transfer of the Bloch lines are not conducted so that the rotating longitudinal magnetic field generator is turned off. Said generator 110 is composed for example of a permanent magnet, with a regulable inclination with respect to the Bloch line memory substrate 101.

Said generator 110 may also be used as the generator of the bias magnetic field.

A control circuit 109 controls the drivers 105, 106, generators 102, 108, 110, detector 107 and sources 103, 104 according to input signals IN.

In the magnetic memory apparatus shown in FIG. 10, the Bloch line recording for information recording and the Bloch line reading for information reading can be effected by the methods described in U.S. Pat. No. 4,583,200.

In the magnetic memory apparatus shown in FIG. 10, the transfer of the Bloch lines is achieved by forming, in the stripe-shaped magnetic domain 6, movable positive and negative magnetic charge areas by means of the charged walls, and moving said magnetic charge areas by means of a field such as a rotating longitudinal magnetic field. Consequently the transfer of the Bloch lines can be achieved at a higher speed, in comparison with the conventional transfer process utilizing in particular a vertical pulse magnetic field. Also the generator 110 for the rotating longitudinal magnetic field can be made more compact than the generator for the conventional vertical pulse magnetic field.

Also in the present magnetic memory apparatus, the write-in and read-out operations of the Bloch lines need not necessarily be done through conversion to or from the magnetic bubbles, but can be achieved by direct formation of Bloch lines in the magnetic wall or by direct reading of Bloch lines in the magnetic wall. Such direct write-in or read-out can be made for example by an optical method, proposed by the assignee of the present invention in U.S. patent application Ser. No. 800,770.

We claim:

1. A method for transferring Bloch lines formed in a magnetic wall of a magnetic domain, comprising the steps of:
   forming a charged wall near the magnetic wall to attract a Bloch line to the charged wall; and
   moving the charged wall to move the Bloch line along the magnetic wall.

2. A transfer method according to claim 1, wherein the charged wall is adapted to move according to the direction of an in-plane magnetic field applied to a magnetic film in which the magnetic domain is formed.

3. A method for transferring Bloch lines formed in a magnetic wall of a magnetic domain, comprising the steps of:
   forming a magnetic pattern area of a predetermined form in the vicinity of a surface of a magnetic film in which the magnetic domain is formed;
   applying an in-plane magnetic field to the magnetic film, to form a charged wall in the magnetic pattern area to attract a Bloch line to the charged wall; and
   rotating the direction of the in-plane magnetic field to move the charged wall, to move the Bloch line along the magnetic wall.

4. A magnetic memory apparatus for recording and reproducing information, utilizing Bloch lines formed in a magnetic wall of a magnetic domain as an information carrier, said apparatus comprising:
   a memory substrate, having a stripe-shaped magnetic domain, where a pattern for generating a charged wall near a magnetic wall of said stripe-shaped magnetic domain is formed;
   means for writing Bloch lines in the magnetic wall of said stripe-shaped magnetic domain according to input information;
   means for reading the Bloch lines stored in the magnetic wall of said stripe-shaped magnetic domain, thereby reproducing the information in the form of electric signals; and
   means for applying a rotating magnetic field parallel to the plane of said memory substrate,
   wherein a Bloch line is transferred along said magnetic wall by moving said charged wall by use of the rotating magnetic field.

5. A method for transferring Bloch line formed in a magnetic wall of a magnetic domain, comprising the steps of:
   applying an in-plane magnetic field which is parallel to a magnetic film in which the magnetic domain is formed; and
   rotating the direction of the in-plane magnetic field, to move a Bloch line from a first position to a second position different therefrom in the magnetic wall.

* * * * *

UNITED STATES PATENT AND TRADEMARK OFFICE
CERTIFICATE OF CORRECTION

PATENT NO. : 4,974,201
DATED : November 27, 1990
INVENTOR(S) : TAKEO ONO ET AL.

It is certified that error appears in the above-identified patent and that said Letters Patent is hereby corrected as shown below:

<u>SHEET 7 OF 7 IN THE DRAWINGS</u>:

FIG. 10, "CONTOROL" should read --CONTROL--.

<u>COLUMN 1</u>

Line 40, "the" (2nd occurrence) should be deleted.

<u>COLUMN 5</u>

Line 47, "KEV" should read --KeV--.

<u>COLUMN 6</u>

Line 49, "Hex" should read Hrot--.

<u>COLUMN 8</u>

Line 2, "domains 6." should read --domain 6.--.
    Line 28, "Hex" should read --Hrot--.
    Line 33, "extends" should read --extend--.
    Line 36, "Hex" should read --Hrot--.
    Line 38, "Hex" should read --Hrot--.

<u>COLUMN 9</u>

Line 67, "be" should read --be made--.

UNITED STATES PATENT AND TRADEMARK OFFICE
CERTIFICATE OF CORRECTION

PATENT NO.   : 4,974,201
DATED        : November 27, 1990
INVENTOR(S)  : TAKEO ONO ET AL.

It is certified that error appears in the above-identified patent and that said Letters Patent is hereby corrected as shown below:

<u>COLUMN 12</u>

Line 30, "line" should read --lines--.

Signed and Sealed this

Twenty-fifth Day of May, 1993

Attest:

MICHAEL K. KIRK

Attesting Officer           Acting Commissioner of Patents and Trademarks